(12) United States Patent
Klimmek et al.

(10) Patent No.: US 12,381,573 B2
(45) Date of Patent: Aug. 5, 2025

(54) MEASURING SYSTEM

(71) Applicant: Phoenix Contact GmbH & Co. KG, Blomberg (DE)

(72) Inventors: Benjamin Klimmek, Aerzen (DE); Felix Schulte, Geseke (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 0 days.

(21) Appl. No.: 17/600,818

(22) PCT Filed: Mar. 26, 2020

(86) PCT No.: PCT/EP2020/058594
§ 371 (c)(1),
(2) Date: Oct. 1, 2021

(87) PCT Pub. No.: WO2020/207816
PCT Pub. Date: Oct. 15, 2020

(65) Prior Publication Data
US 2022/0209787 A1   Jun. 30, 2022

(30) Foreign Application Priority Data

Apr. 11, 2019   (LU) .................................. LU101173

(51) Int. Cl.
*H03M 1/80*   (2006.01)
*H03M 11/24*   (2006.01)

(52) U.S. Cl.
CPC ........... *H03M 1/808* (2013.01); *H03M 11/24* (2013.01)

(58) Field of Classification Search
CPC ........................... H03M 11/24; H03M 11/808
See application file for complete search history.

(56) References Cited

U.S. PATENT DOCUMENTS

| | | | |
|---|---|---|---|
| 4,649,371 A | 3/1987 | Kolluri | |
| 5,045,832 A | 9/1991 | Tam | |

(Continued)

FOREIGN PATENT DOCUMENTS

| | | |
|---|---|---|
| CN | 101741233 A | 6/2010 |
| DE | 42 40 447 C1 | 9/1993 |

(Continued)

*Primary Examiner* — Patrick C Chen
(74) *Attorney, Agent, or Firm* — Holland & Hart LLP

(57) ABSTRACT

A measuring system for detecting switching states including a signal converter having signal inputs to each of which an associated binary switching signal representing a switching state can be applied. Electrical resistors, at which an associated measurement signal can be tapped on the basis of the associated binary switching signal, is connected downstream of each of the signal inputs, wherein the electrical resistors have resistance values, which differ from each other, and wherein the electrical resistors are connected in parallel to each other. The signal converter also has a signal output, which is connected downstream of the electrical resistors in order to provide a sum measurement signal at the signal output with a sum current strength, which sum measurement signal is formed from the sum of the measurement signals, and wherein the sum measurement signal has a current strength which can be uniquely assigned to a current strength reference value.

20 Claims, 3 Drawing Sheets

(56) References Cited

U.S. PATENT DOCUMENTS

| | | | |
|---|---|---|---|
| 5,965,961 A | 10/1999 | Lampe | |
| 8,618,959 B2 | 12/2013 | Griffin | |
| 2008/0018300 A1 | 1/2008 | Zaag et al. | |
| 2008/0174259 A1* | 7/2008 | Miettinen | G08C 19/02 |
| | | | 323/283 |
| 2009/0267651 A1* | 10/2009 | Maimone | H03M 11/22 |
| | | | 327/63 |
| 2013/0106200 A1* | 5/2013 | Wagner | G01R 31/327 |
| | | | 324/415 |
| 2016/0344177 A1* | 11/2016 | Wang | H02H 3/08 |

FOREIGN PATENT DOCUMENTS

| | | | |
|---|---|---|---|
| DE | 692 13 505 T2 | 1/1997 | |
| DE | 102007010591 A1 | 9/2008 | |
| DE | 100 42 227 A1 | 3/2022 | |
| EP | 736419 A2 * | 10/1996 | B60R 16/027 |
| EP | 0895362 A1 | 2/1999 | |
| RU | 2513913 C2 | 4/2014 | |

* cited by examiner

MEASURING SYSTEM

CROSS-REFERENCE

The present application is the national phase entry under 35 U.S.C. 371 of International Patent Application No. PCT/EP2020/058594 by Klimmek et al., entitled "MEASURING SYSTEM," filed Mar. 26, 2020, and claims the benefit of Luxembourg Patent Application No. LU101173 by Klimmek et al., entitled "MESSSYSTEM," filed Apr. 11, 2019, each of which is assigned to the assignee hereof, and each of which is expressly incorporated by reference in its entirety herein.

TECHNICAL FIELD

The present disclosure relates to a measurement system for converting binary switching signals into a sum measurement signal.

BACKGROUND

Measurement systems with a signal converter, in particular a multiplexer, are typically configured to map a plurality of input signals onto a single output signal, wherein the input signals can be uniquely reconstructable from the output signal. For example, a plurality of binary voltage signals can be converted into a discrete voltage signal with a plurality of possible voltage values. Accordingly, a unique combination of the binary voltage signals can be assigned to each voltage value. The binary voltage signals can, however, experience a voltage amplitude reduction depending on a line length between the respective generator of the voltage signal and the signal converter, whereby an error rate in the interpretation of the voltage signal can be increased. Furthermore, a transmission of the discrete voltage signal can also be affected by a line-dependent voltage amplitude reduction.

SUMMARY

It is the object of the present disclosure to provide an efficient measuring system for detecting switching states.

This object is achieved by the features of the independent claim. Advantageous examples are the subject matter of the dependent claims, the description, and the accompanying figures.

The present disclosure is on the basis of the knowledge that the above object can be achieved by a measuring system having a signal converter, which receives binary switching signals and converts them into a multi-level output signal, the binary switching signals representing a switched-on state or a switched-off state. The multi-level output signal can in particular be an amplitude-discrete signa, which maps the binary switching signals onto a single amplitude value. The output signal can also be time-discrete and accordingly a digital signal. The signal converter is adapted to generate a discrete output signal which allows conclusions to be drawn about each binary switching signal, in particular whether a respective switch-on or switch-off state is present. In particular, the signal converter has electrical resistors to each of which an associated binary switching signal is applied at a first resistance connection and which are connected to the signal output in parallel via a second resistance connection. Correspondingly, an output signal with a current strength can flow through the signal output which uniquely maps the binary switching signals.

According to a first aspect, the disclosure relates to a measuring system for detecting switching states. The measuring system comprises a signal converter having a first signal input to which a first binary switching signal can be applied and a second signal input to which a second binary switching signal can be applied. The first binary switching signal represents a first switching state and the second binary switching signal represents a second switching state. Furthermore, the signal converter comprises a first electrical resistor, which is connected downstream of the first signal input and at which a first measurement signal with a first current strength can be tapped on the basis of the first binary switching signal and a second electrical resistor, which is connected downstream of the second signal input and at which a second measurement signal with a second current strength can be tapped on the basis of the second binary switching signal.

The second electrical resistor has a resistance value that is different from a resistance value of the first electrical resistor, and wherein the second electrical resistor is connected in parallel to the first electrical resistor.

The signal converter also has a signal output, which is preceded by the first electrical resistor and the second electrical resistor in order to provide a sum measurement signal with a sum current strength at the signal output, which is formed from the sum of the first measurement signal and the second measurement signal. The sum measurement signal can have a current strength which can be uniquely assigned to a current strength reference value from a plurality of current strength reference values, and the first switching signal and the second switching signal can be determined from the current strength value.

The measuring system further comprises a controller which is adapted to receive the sum measurement signal and to determine the first switching state and the second switching state on the basis of the sum current strength of the sum measurement signal.

The measuring system is adapted in particular to convert discrete, in particular binary, switching signals, which are sent by different devices, into discrete standardized signals. In particular, the sum current strength of the sum measurement signal can be in the range of a 4-20 mA loop. To each binary switching signal a predetermined amplitude of an electrical parameter can be assigned to, in particular a current strength and/or a voltage, via a respective predetermined electrical resistance. A device status, for example an on/off switching state, can be assigned to the binary switching signals and to the corresponding associated measurement signals. The binary switching signals can indicate a switched-off state with a first switching signal level and can indicate a switched-on state with a second switching signal level. The respective signal level can be realized by a current strength or a voltage.

With the multiplexing of a plurality of binary switching signals into a single sum measurement signal, a reduced number of signal inputs can be formed at the controller, which is connected downstream of the signal converter. Furthermore, the signal converter can also be configured to detect electrical parameters in order to increase a number of possible signal inputs.

Furthermore, the signal inputs can be configured to receive electrical signals which represent, for example, a valve position, a direction of rotation, a counter reading, or a flow rate. Correspondingly, the signal inputs can each be configured to receive a discrete, in particular multi-valued, signal and to convert it into an associated measurement signal. For example, a value range of the sum measurement signal can be assigned to each measurement signal in order to map a value range of the respective multivalued signal in the sum measurement signal.

The signal input can have a plug connection for the detachable connection of a signal line in order to be able to flexibly connect different signal sources to the respective signal input. Furthermore, a plurality of signal inputs can be combined to form a signal connection block, which are arranged in a plug or socket housing and can be connected to a corresponding socket or plug counterpart.

The electrical resistors can in particular be ohmic resistors with fixed resistance values. Furthermore, the resistance values of the electrical resistors can be adaptable in order to compensate for tolerances and/or age-related changes in the resistance values. The signal inputs, electrical resistors and the signal output can in particular be implemented in the form of an integrated circuit in order to obtain an efficient and/or space-saving configuration of the signal converter.

In one example, the first measurement signal has a predetermined current strength and the second measurement signal has a further predetermined current strength, wherein the sum measurement signal is increased by the respective predetermined current strength when the associated binary switching signal is switched on.

In one example, the controller is configured to assign the sum measurement signal to a reference value from a plurality of reference values, wherein a unique combination of switching states is assigned to each reference value by means of a reference value table in order to uniquely determine the switching states on the basis of the assignment of the sum measurement signal to the reference value.

The predetermined current intensities can in particular be stored in a reference value table in the controller in order to enable the binary switching signals to be identified on the basis of the sum measurement signal. In particular, the predetermined current intensities can be different from one another. The current strengths are also set by means of the electrical resistors in such a way that a unique assignment of the current strength of the sum measurement signal to the associated binary switching signals is possible. With N signal inputs, for example, 2N possible combinations of binary switching signals can be mapped. Correspondingly, the sum measurement signal 2N can have different current strength levels. A predetermined combination of the switching signals is assigned to each current level in the reference value table.

In one example, the signal output is configured to provide an output signal with a current strength in a predetermined range, in particular from 0 mA to 24 mA, as a function of the binary switching signals. In one example, in relation to SPS standards, a current of up to 31 mA can occur in particular in the event of a fault. Therefore, the predetermined current range can be 0 mA to 31 mA.

A distance between the current strength levels can depend on a precision of the electrical resistors, the electrical lines, and a downstream evaluation circuit, in particular a device control. For example, the signal converter can be adapted to generate a sum measurement signal which has discrete current strength values with a distance in the range from 0.1 mA to 10 mA. A unique assignment of the current values of the sum measurement signal to the respective combination of binary switching signals would then be possible up to a deviation of ±0.05 mA to 0.5 mA.

In one example, the measuring system comprises a first switching element and a second switching element, wherein the first switching element can be connected upstream of the first signal input and is configured to switch a signal line in order to apply the first binary switching signal to the first signal input, and wherein the second switching element can be connected upstream of the second signal input and is configured to switch a further signal line in order to apply the second binary switching signal to the second signal input.

By tapping current strength information, the arrangement of the switching elements can be independent, in particular with regard to the signal inputs. For example, the switching elements can be arranged remotely from the respective signal inputs. Furthermore, an evaluation circuit, in particular the controller, which taps the sum measurement signal, can be arranged remotely from the signal converter, since the current strength of the sum measurement signal can be invariant to a distance between the signal converter and the control.

In one example, the first switching element is arranged at a distance from the first signal input and is connected to the first signal input by means of the signal line, the signal line being configured to route the first switching signal unchanged from the first switching element to the signal input regardless of the distance. This has the advantage, for example, that the signal converter, the switching elements and/or a controller which evaluates the sum measurement signal can be arranged spatially independently of one another. As a result, a functionally separate arrangement of these elements can also be implemented. For example, the switching elements can be arranged outside a control cabinet.

In one example, the first measurement signal is a status signal of the first binary switching signal, which describes a switched-on state or a switched-off state of the first switching element, and the second measurement signal is a further status signal of the second binary switching signal, which describes an switched-on state or a switched-off state of the second switching element. The switching elements can for example be electronic switches or mechanical switches which are configured to apply an electrical potential to the respective signal input by switching an electrical line. Furthermore, the switching elements can be integrated into the measuring system, the measuring system being configured to detect a plurality of physical variables and to switch the respective switching element as a function of the respective physical variable. The respective switching element can be switched to be electrically conductive and correspondingly signal a switched-on state at the respective signal input, or the respective switching element can be switched electrically non-conductive and correspondingly signal a switched-off state at the respective signal input.

In one example, an unambiguous sum measurement signal can be assigned to each switching combination of the first switching element and the second switching element by means of the electrical resistors connected in parallel. For example, the electrical resistors can have staggered resistance values, the respective resistance value halving or doubling in relation to the respectively closest resistance values.

In one example, the resistance values of the electrical resistors connected in parallel are selected in such a way that the different sum measurement signals, in accordance with the switching combination of the first switching element and the second switching element, have a minimum current strength distance, in particular 1 mA. The minimum current strength distance can preferably be 0.1 mA.

In one example, the measuring system can be supplied with electrical energy, in particular with a supply voltage, via the signal output. The signal converter can be connected to a communication bus by means of the signal output, and electrical energy can be supplied to the measuring system via the signal output.

In one example, the measurement system comprises an energy source, in particular a switched-mode power supply, which is configured to supply the measurement system, in particular the signal converter, with electrical energy in order to generate the first measurement signal and/or the second measurement signal. The measuring system can be connected to a direct current source, for example, which supplies the measuring system with a voltage between 5 V and 50 V, in particular with 12 V or 24 V.

In one example, the signal converter comprises a plurality of signal inputs and a plurality of electrical resistors, wherein an electrical resistor is connected downstream of each signal input and the electrical resistors are connected upstream of the signal output in parallel to one another. In particular, a number of signal amplitudes of the sum measurement signal can be proportional to a number of signal inputs, so that the signal range of the sum measurement signal is segmented according to a number of binary input signals. This segmentation of the sum measurement signal can be predetermined using the reference value table.

In one example, the plurality of electrical resistors is configured to provide an associated measurement signal at the signal output in accordance with the associated binary switching signal, each signal combination of the measurement signals at the signal output having an equidistant current strength difference to the respective adjacent signal combinations.

In one example, the signal output has a first connection pole and a second connection pole, which are coupled to one another by means of an electrical base resistor, wherein by means of the base resistor a sum measurement signal with a minimum current strength is provided at the signal output. The minimum current strength can be identified by means of the reference value table as a switching state in which a switch-off state is signaled at all signal inputs, so that no contributions to the sum measurement signal are made via the signal inputs. Accordingly, this shutdown state of all signal inputs is clearly defined with the minimum current strength. If a sum measurement signal is detected at the signal output which has a current strength below the minimum current strength, a fault, for example a short circuit or a defective electrical resistance, may be present in the measurement system.

In one example, the measuring system comprises an isolating amplifier, which is connected upstream of the signal output and is configured to provide a supply voltage at the signal output, the isolating amplifier also being configured to evaluate the sum measurement signal and convert a control signal according to a reference value table and provide it at the signal output. The isolation amplifier can furthermore have a repeater power supply circuit which can be configured to amplify an energy supply, in particular to increase a voltage level that is reduced due to distance losses. The repeater power supply circuit can be connected upstream of the signal output. Furthermore, the isolating amplifier can have a control loop circuit, which can in particular be connected between the repeater power supply circuit and the signal output. The isolation amplifier can be integrated in the signal converter.

In one example, the controller is configured to evaluate the sum measurement signal and to display an error state if the sum measurement signal falls below a first current strength limit value or exceeds a second current strength limit value.

Furthermore, the controller can be configured to process the sum measurement signal on the basis of the reference value table in order to decode the individual switching signals from the sum measurement signal, in particular to demux them. The controller can in particular be arranged remotely from the signal converter, since by converting the switching signals into a current strength of the sum measurement signal, this current strength can be processed independently of a distance between the signal converter and the controller. The controller can be connected to the signal output of the signal converter, in particular via a communication bus.

BRIEF DESCRIPTION OF THE DRAWINGS

Further examples are explained with reference to the accompanying figures.

DETAILED DESCRIPTION

Figure 1:
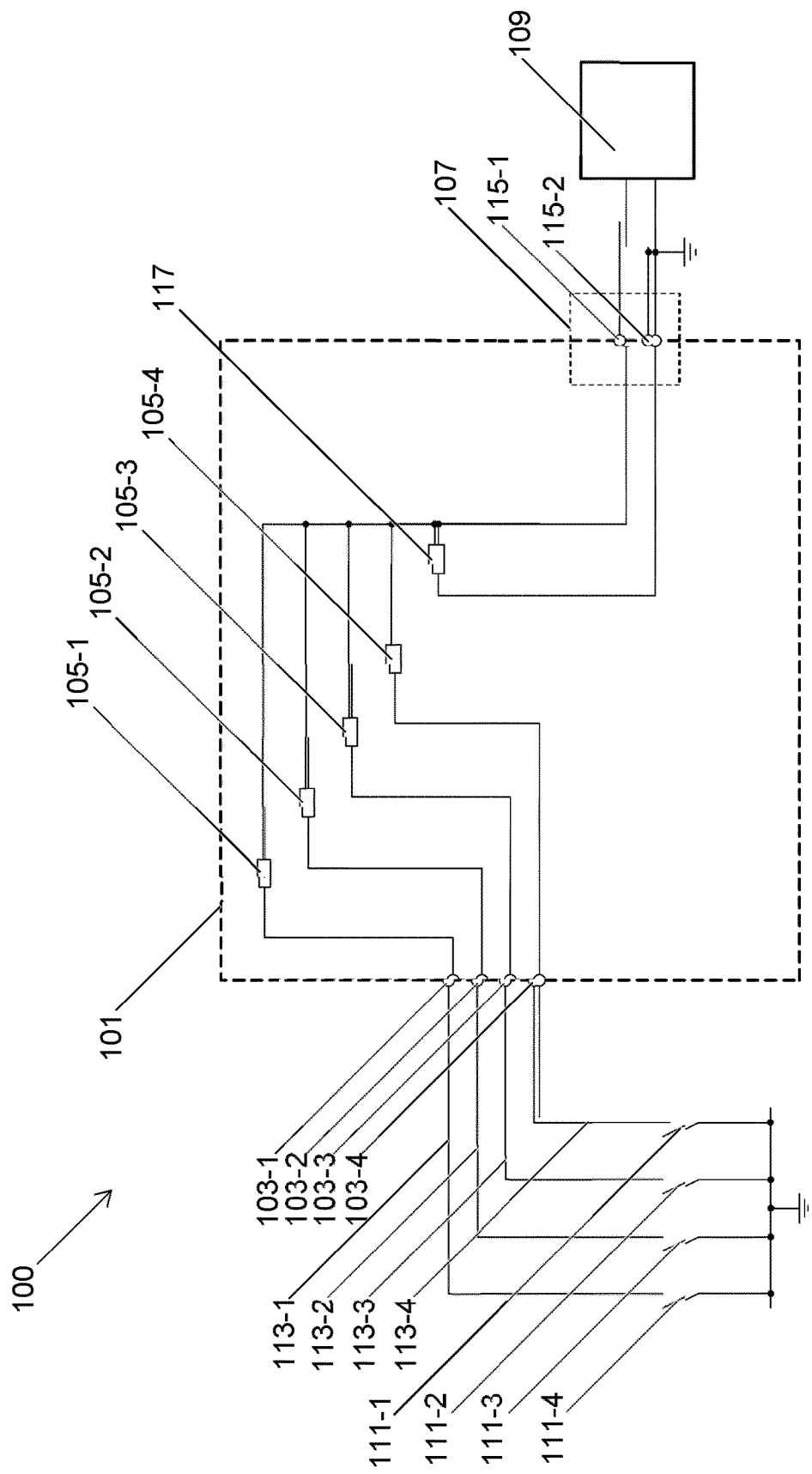
FIG. 1 shows a measuring system in accordance with aspects of the disclosure.

FIG. 1 shows a schematic representation of a measuring system 100 for detecting switching states, comprising a signal converter 101. The signal converter 101 comprises four signal inputs 103-1 to 103-4, to each of which a binary switching signal can be applied. Each of the binary switching signals represents a corresponding switching state. An electrical resistor 105-1 to 105-4, at which an associated measurement signal with a respective current strength can be tapped on the basis of the respective switching signal, is connected downstream of each of the signal inputs 103-1 to 103-4.

The signal converter 101 further comprises a signal output 107, the electrical resistors 105-1 to 105-4 being connected upstream of the signal output 107 in order to provide a sum measurement signal at the signal output 107, which is formed from the sum of the measurement signals.

The electrical resistors 105-1 to 105-4 are connected in parallel to one another, in particular in a star shape. The electrical resistors are connected with a respective first resistance connection to the respective signal input and are connected with a respective second resistance connection to the signal output 107. Furthermore, the electrical resistors 105-1 to 105-4 have mutually different resistance values.

The sum measurement signal has a sum current strength which can be uniquely assigned to a current strength reference value from a plurality of current strength reference values. The respective switching signals can be determined by means of the current strength value.

The associated measurement signal has a predetermined current strength, wherein the sum measurement signal is increased by the respective predetermined current strength when the associated binary switching signal is switched on. Furthermore, the signal output 107 is configured to provide an output signal with a current strength in a predetermined range, in particular from 0 mA to 31 mA, as a function of the binary switching signals.

Furthermore, the measuring system 100 comprises four switching elements 111-1 to 111-4, each of the switching elements 111-1 to 111-4 being connected upstream of a respective signal input 103-1 to 103-4 and configured to switch a respective signal line 113-1 to 113-4 to apply the associated binary switching signal to the respective signal input 103-1 to 103-4. The switching elements 111-1 to 111-4 are arranged at a distance from the respective assigned signal input 103-1 to 103-4 and are connected to signal inputs 103-1 to 103-4 by means of the signal lines 113-1 to 113-4. The signal lines 113-1 to 113-4 are configured to route the respective switching signal unchanged from the respective switching element 111-1 to 111-4 to the respective signal input 103-1 to 103-4, regardless of the distance.

The associated measurement signal is a status signal of the associated binary switching signal, which describes a switched-on state or a switched-off state of the respective switching element 111-1 to 111-4. By means of the electrical resistors 105-1 to 105-4 connected in parallel, a unique sum measurement signal can be assigned to each switching combination of the switching elements 111-1 to 111-4. The resistance values of the electrical resistors 105-1 to 105-4 connected in parallel are selected in such a way that the different sum measurement signals corresponding to the switching combination of the switching elements 111-1 to 111-4 have a minimum current difference, in particular 1 mA.

The switching elements 111-1 to 111-4 are formed as two-poles, wherein the switching elements 111-1 to 111-4 are connected with a first switching contact pole with a common ground potential and with a second switching contact pole via the respective signal line 113-1 to 113-4 with the respective signal input 103-1 to 103-4.

The measuring system 100, in particular the signal converter 101, is supplied with electrical energy, for example with a supply voltage, via the signal output 107. The signal output 107 has a first connection pole 115-1 and a second connection pole 115-2, which are coupled to one another by means of an electrical base resistor 117. A sum measurement signal with a minimum current strength is provided at the signal output 107 via the base resistor 117. The base resistor 117 is connected in parallel to the further electrical resistors 105-1 to 105-4.

Furthermore, a controller 109 is connected downstream of the signal converter 101, said control 109 being configured to receive the sum measurement signal and to determine the first switching signal and the second switching signal by means of the current strength of the sum measurement signal. In particular, the controller 109 is configured to determine the first switching state and the second switching state on the basis of the sum current strength of the sum measurement signal.

The controller 109 is configured to assign the sum measurement signal to a reference value from a plurality of reference values, wherein a unique combination of switching states is assigned to each reference value by means of a reference value table in order to clearly determine the switching states on the basis of the assignment of the sum measurement signal to the reference value.

The controller 109 is also configured to evaluate the sum measurement signal, in particular the current value of the sum measurement signal, and to indicate an error state if the sum measurement signal falls below a first current limit value or exceeds a second current limit value. The controller 109 can be connected to the signal output 107, in particular via the contact poles 115-1, 115-2. Furthermore, the contact pole 115-2 can be connected to a ground potential. The controller 109 can in particular be a DCS card, which has at least one analog input to each of which the sum measurement signal can be applied to. The controller 109 can be connected to the signal converter 101 actively or passively, in particular by means of an isolation amplifier (RPSS), via the 4-20 mA line circuit.

TABLE 1

Example of a reference value table for a sum measurement signal

| Loop Current (mA) | | | | Channel Status | | | |
| Average | Tolerance | Failure | Status | nA (S1) | nB (S2) | nC (S3) | nD (S4) |
| --- | --- | --- | --- | --- | --- | --- | --- |
| 4 mA | +/−0.5 mA | ≤3.4 mA | 0 | 0 | 0 | 0 | 0 |
| 5 mA | +/−0.5 mA | | 1 | 1 | 0 | 0 | 0 |
| 6 mA | +/−0.5 mA | | 2 | 0 | 1 | 0 | 0 |
| 7 mA | +/−0.5 mA | | 3 | 1 | 1 | 0 | 0 |
| 8 mA | +/−0.5 mA | | 4 | 0 | 0 | 1 | 0 |
| 9 mA | +/−0.5 mA | | 5 | 1 | 0 | 1 | 0 |
| 10 mA | +/−0.5 mA | | 6 | 0 | 1 | 1 | 0 |
| 11 mA | +/−0.5 mA | | 7 | 1 | 1 | 1 | 0 |
| 12 mA | +/−0.5 mA | | 8 | 0 | 0 | 0 | 1 |
| 13 mA | +/−0.5 mA | | 9 | 1 | 0 | 0 | 1 |
| 14 mA | +/−0.5 mA | | 10 | 0 | 1 | 0 | 1 |
| 15 mA | +/−0.5 mA | | 11 | 1 | 1 | 0 | 1 |
| 16 mA | +/−0.5 mA | | 12 | 0 | 0 | 1 | 1 |
| 17 mA | +/−0.5 mA | | 13 | 1 | 0 | 1 | 1 |
| 18 mA | +/−0.5 mA | | 14 | 0 | 1 | 1 | 1 |
| 19 mA | +/−0.5 mA | ≥19.6 mA | 15 | 1 | 1 | 1 | 1 |

A corresponding channel identifier nA, nB, nC, nD can be assigned to the signal inputs 103-1 to 103-4 according to Table 1. The binary switching signals at the signal inputs nA to nD can have two different signal states. A first signal state is identified by a "1" and corresponds to a switched-on state of the respective switching element 111-1 to 111-4. A second signal state is identified by a "0" and corresponds to a switch-off state of the respective switching element 111-1 to 111-4. A respective identifier S1, S2, S3, S4 can be assigned to the switching elements 111-1 to 111-4 in accordance with Table 1.

With the reference value table, a unique status 0 to 15 can be assigned to each combination of signal states of the four switching elements 111-1 to 111-4, whereby 16 different states can be generated with 4 binary switching signals. The measuring system 100 is configured to generate an unambiguous current strength at the signal output 107 for each signal combination by means of the electrical resistors 105-1 to 105-4, which corresponds to the respective current strength value assigned by means of the reference value table on average over time. A clear identification of the switching states of the switching elements 111-1 to 111-4 is possible up to a deviation of ±0.5 mA of the current values from the respective reference value according to Table 1. If the sum measurement signal has a current strength below 3.4 mA or a current strength above 19.6 mA, an error state of the measuring system 100 can be recognized using the reference value table.

Figure 2:
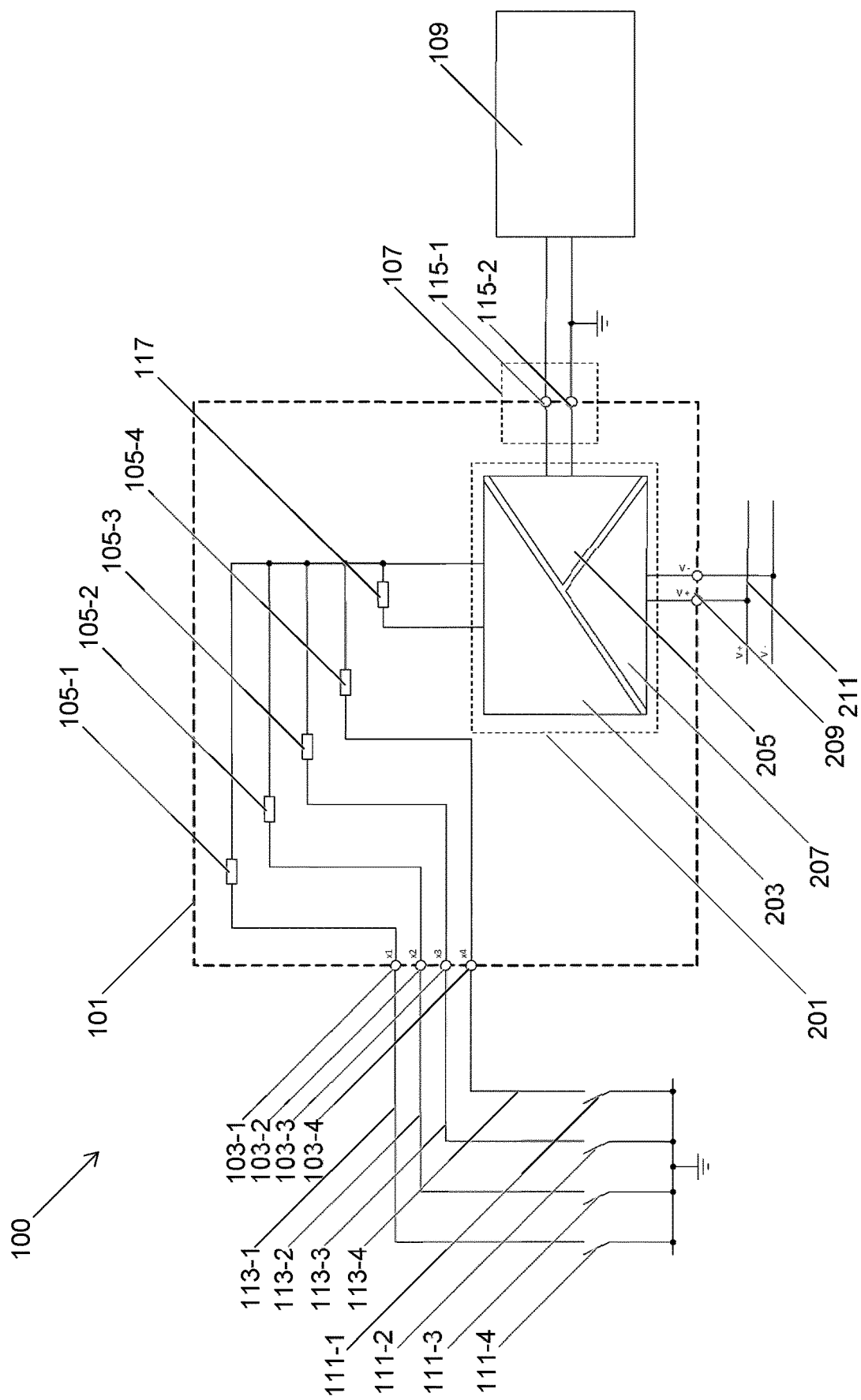
FIG. 2 shows a measuring system in accordance with aspects of the disclosure.

FIG. 2 shows a schematic illustration of a measuring system 100 with a plurality of signal inputs 103-1, 103-2, 103-3, 103-4 and a plurality of electrical resistors 105-1, 105-2, 105-3, 105-4, whereby each signal input 103-1, 103-2, 103 3, 103-4 is followed by an electrical resistor 105-1, 105-2, 105-3, 105-4 and the electrical resistors 105-1, 105-2, 105-3, 105-4 are connected upstream of the signal output 107 in parallel to one another.

The plurality of electrical resistors 105-1, 105-2, 105-3, 105-4 is configured to provide an associated measurement signal at the signal output 107 in accordance with the associated binary switching signal, and wherein each signal combination of the measurement signals at the signal output 107 has an equidistant current distance to the respective adjacent signal combinations.

Furthermore, the measuring system 100 comprises an isolating amplifier 201, which is connected upstream of the signal output 107 and is configured to provide a supply voltage at the signal output 107, the isolating amplifier 201 also being configured to evaluate the sum measurement signal and to convert a control signal according to a reference value table and to provide it at the signal output 107. The isolation amplifier 107 is part of the signal converter 101.

The isolation amplifier 201 can furthermore have a repeater power supply circuit 203 which is configured to amplify an energy supply, in particular to increase a voltage level that is reduced due to distance losses. The repeater power supply circuit 203 is connected upstream of the signal output 107.

The isolation amplifier 201 also has a control loop circuit 205, which can be connected in particular between the repeater power supply circuit 203 and the signal output 107. The isolation amplifier 201 further comprises a supply connection 207, which is connected to a DC voltage supply 211 by means of a connection terminal 209.

Figure 3:
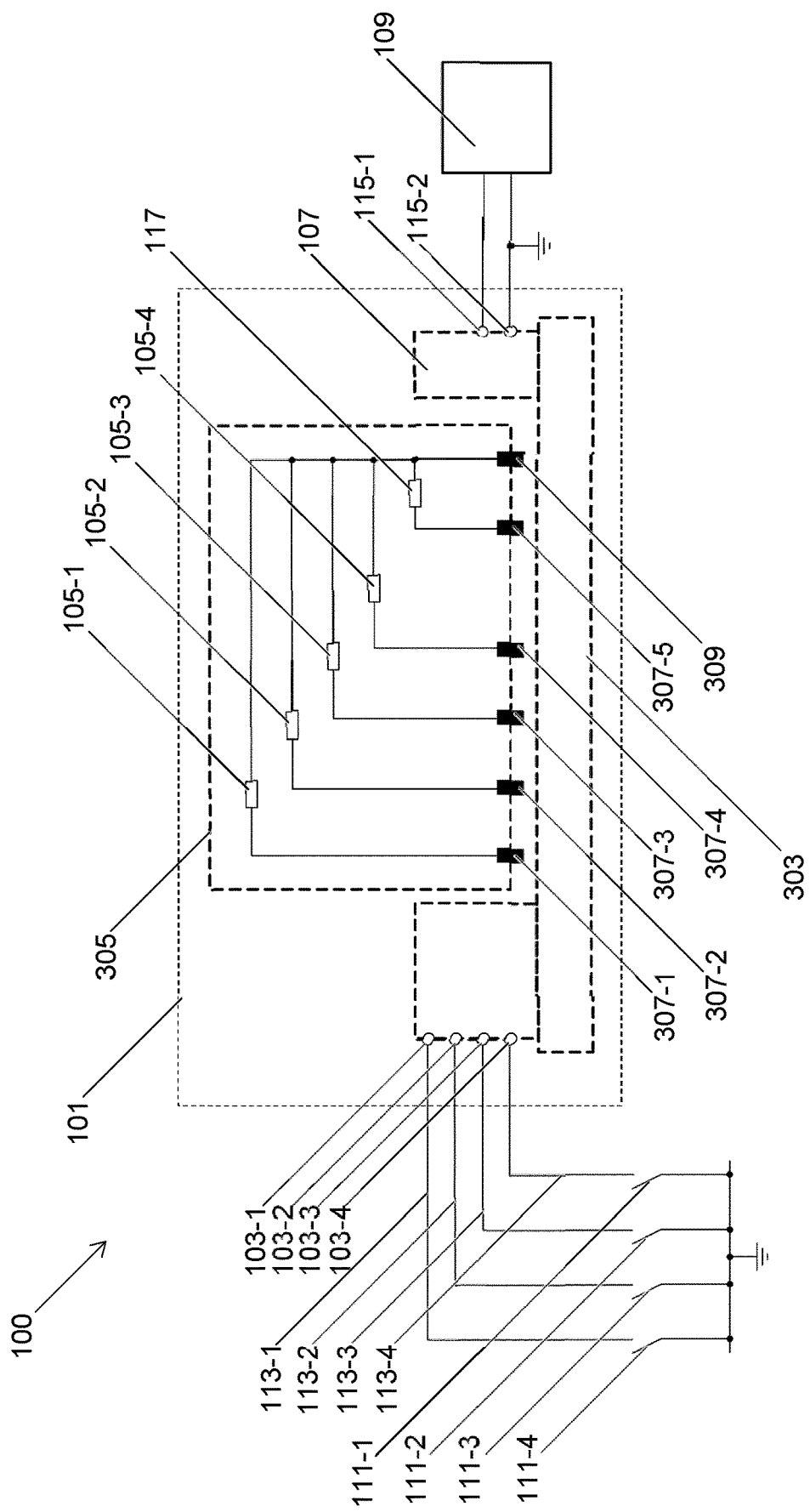
FIG. 3 shows a measuring system in accordance with aspects of the disclosure.

FIG. 3 shows a schematic representation of a measuring system 100 for detecting switching states with a signal converter 101. The signal converter 101 comprises four signal inputs 103-1 to 103-4, each of which can be supplied with a binary switching signal. An electrical resistor 105-1 to 105-4 is connected downstream to each of the signal inputs 103-1 to 103-4, at which electrical resistor an associated measurement signal can be tapped on the basis of the respective switching signal.

In particular, the signal inputs 103-1 to 103-4 are connected to the electrical resistors 105-1 to 105-4 via a VIP IO marshaling base element 303. The VIP IO marshaling base element 303 can in particular be a control unit which is configured to flexibly connect the signal inputs 103-1 to 103-4 with different electrical resistors 105-1 to 105-4. Furthermore, the VIP IO marshaling base element 303 can be configured to obtain an unambiguous assignment between the electrical resistors 105-1 to 105-4 and the signal inputs 103-1 to 103-4. Furthermore, the base resistor 117 can also be connected to the VIP IO marshaling base element 303. The VIP IO marshalling base element 303 can have a plug connection onto each of which a converter module 305 can be plugged, which comprises the resistors 105-1 to 105-4 and 117.

The signal converter 101 further comprises a signal output 107, the electrical resistors 105-1 to 105-4 being connected upstream of the signal output 107, in order to provide a sum measurement signal at the signal output 107, which sum measurement signal is formed from the sum of the measurement signals. The signal output 107 can be arranged in the VIP IO marshaling base element 303.

The electrical resistors 105-1 to 105-4 are connected in parallel to one another, in particular in a star shape. The electrical resistors 105-1 to 105-4 have mutually different resistance values. Each resistor 105-1 to 105-4 and 117 is connected with a first resistor connection via a respective contact terminal 307-1 to 307-5 to the VIP IO marshalling base element 303, wherein the resistors 105-1 to 105-4 and 117 are connected to the VIP IO marshaling base element 303 with a respective second resistor connection via a common contact terminal 309.

The controller 109 can in particular be a UIO card which has at least one universal signal input, which is configured to receive an analog signal, in particular the sum measurement signal. In particular, the controller 109 can be actively supplied with electrical energy via the 4-20 mA line circuit.

REFERENCE SYMBOLS 100 measuring system
101 signal converter
103-1 signal input
103-2 signal input
103-3 signal input
103-4 signal input
105-1 resistor
105-2 resistor
105-3 resistor
105-4 resistor
107 signal output
109 Control
111-1 switching element
111-2 switching element
111-3 switching element
111-4 switching element
113-1 signal line
113-2 signal line
113-3 signal line
113-4 signal line
115-1 connection pole
115-2 connection pole
117 base resistor
201 isolating amplifier
203 repeater power supply circuit
205 control loop circuit
207 supply connection
209 connection terminal
211 DC power supply
303 VIP IO Marshalling base element
305 converter module
307-1 contact terminal
307-2 contact terminal
307-3 contact terminal
307-4 contact terminal
307-5 contact terminal
309 contact terminal

What is claimed is:

1. A measuring system for detecting switching states, comprising:
   a signal converter having:
     a plurality of signal inputs combined to form a signal connection block and arranged in a plug or socket housing, the plurality of signal inputs being configured to connect to a corresponding plug or socket counterpart, wherein a first signal input of the plurality of signal inputs is configured to receive a first binary switching signal that represents a first switching state and a second signal input of the plurality of signal inputs is configured to receive a second binary switching signal that represents a second switching state,
     a first electrical resistor connected downstream of the first signal input and configured for a first measurement signal with a first current strength to be tapped based at least in part on the first binary switching signal,
     a second electrical resistor connected downstream of the second signal input and configured for a second measurement signal with a second current strength to be tapped based at least in part on the second binary switching signal, the second electrical resistor having a resistance value that is different from a resistance value of the first electrical resistor, and wherein the second electrical resistor is connected in parallel to the first electrical resistor, and a signal output, wherein the first electrical resistor and the second electrical resistor are connected upstream of the signal output to provide a sum measurement signal with a sum current strength at the signal output wherein the sum measurement signal is formed from the sum of the first measurement signal and the second measurement signal, wherein the sum measurement signal has a current strength value uniquely assigned to a current strength reference value from a plurality of current strength reference values; and a controller configured to receive the sum measurement signal and to determine the first switching state and the second switching state based at least in part on the sum current strength of the sum measurement signal, wherein the controller is further configured to determine the first binary switching signal and the second binary switching signal from the current strength value.

2. The measuring system of claim 1, wherein:
the first measurement signal has a predetermined current strength and the second measurement signal has a further predetermined current strength, and
the sum measurement signal is increased by the respective predetermined current strength when the associated binary switching signal is switched on.

3. The measuring system of claim 1, wherein the controller is configured to:
assign the sum measurement signal to a reference value from a plurality of reference values, wherein a unique combination of switching states is assigned to each reference value based at least in part on a reference value table to uniquely determine the switching states based at least in part on the assignment of the sum measurement signal to the reference value.

4. The measuring system of claim 1, wherein the signal output is configured to:
provide an output signal with a current strength in a predetermined range based at least in part on the first binary switching signal and the second binary switching signal, the predetermined range being between 0 mA and 31 mA.

5. The measuring system of claim 1, further comprising:
a first switching element; and
a second switching element, wherein:
the first switching element is connected upstream of the first signal input and configured to switch a signal line to apply the first binary switching signal to the first signal input, and
the second switching element is connected upstream of the second signal input and configured to switch a further signal line to apply the second binary switching signal to the second signal input.

6. The measuring system of claim 5, wherein:
the first switching element is arranged at a distance from the first signal input and is connected to the first signal input by the signal line, and
the signal line is configured to route the first binary switching signal unchanged from the first switching element to the first signal input independently of the distance.

7. The measuring system of claim 5, wherein:
the first measurement signal is a status signal of the first binary switching signal, wherein a switched-on state or a switched-off state of the first switching element is based at least in part on the first measurement signal, and
the second measurement signal is a further status signal of the second binary switching signal, wherein the switched-on state or the switched-off state of the second switching element is based at least in part on the second measurement signal.

8. The measuring system of claim 5, wherein an unambiguous sum measurement signal is assigned to each switching combination of the first switching element and the second switching element based at least in part on the first electrical resistor and the second electrical resistor being connected in parallel.

9. The measuring system of claim 5, wherein the resistance value of the first electrical resistor and the resistance value of the second electrical resistor connected in parallel are selected so that the different sum measurement signals, in accordance with the switching combination of the first switching element and the second switching element, have a minimum current strength distance.

10. The measuring system of claim 1, wherein the measuring system is supplied with electrical energy via the signal output, the electrical energy being supplied by a supply voltage.

11. The measuring system of claim 1, further comprising:
an energy source configured to supply the measuring system with electrical energy to generate the first measurement signal, the second measurement signal, or both.

12. The measuring system of claim 1, further comprising:
a plurality of electrical resistors, wherein an electrical resistor is connected downstream of each signal input of the plurality of signal inputs and the plurality of electrical resistors are connected upstream of the signal output in parallel to one another.

13. The measuring system of claim 12, wherein the plurality of electrical resistors is configured to:
provide an associated measurement signal at the signal output in accordance with the associated binary switching signal, each signal combination of the measurement signals at the signal output having an equidistant current distance to the respective adjacent signal combinations.

14. The measuring system of claim 1, wherein the signal output has a first connection pole and a second connection pole coupled to one another by an electrical base resistor, wherein a sum measurement signal with a minimum current strength is provided at the signal output based at least in part on the electrical base resistor.

15. The measuring system of claim 1, further comprising:
an isolating amplifier connected upstream of the signal output and configured to provide a supply voltage at the signal output, wherein the isolating amplifier is further configured to evaluate the sum measurement signal and convert a control signal according to a reference value table and to provide it at the signal output.

16. The measuring system of claim 1, wherein the controller is configured to:
evaluate the sum measurement signal and to indicate an error state if the sum measurement signal falls below a first current limit value or exceeds a second current limit value.

17. A method for detecting switching states, comprising:
applying a first binary switching signal to a first signal input, the first binary switching signal representing a first switching state;

applying a second binary switching signal to a second signal input, the second binary switching signal representing a second switching state, wherein the first signal input and the second signal input are in a plurality of signal inputs combined to form a signal connection block and arranged in a plug or socket housing, the plug or socket housing being configured to connect to a corresponding plug or socket counterpart;

tapping, based at least in part on the first binary switching signal, a first measurement signal with a first current strength at a first electrical resistor connected downstream of the first signal input;

tapping, based at least in part on the second binary switching signal, a second measurement signal with a second current strength at a second electrical resistor connected downstream of the second signal input, the second electrical resistor having a resistance value that is different from a resistance value of the first electrical resistor and being connected in parallel to the first electrical resistor;

summing the first measurement signal and the second measurement signal, wherein a sum measurement signal with a sum current strength is provided at a signal output based at least in part on summing the first measurement signal and the second measurement signal, wherein the first electrical resistor and the second electrical resistor are connected upstream of the signal output, and wherein the sum measurement signal has a current strength value uniquely assigned to a current strength reference value from a plurality of current strength reference values;

receiving the sum measurement signal;

determining the first switching state and the second switching state based at least in part on the sum current strength of the sum measurement signal; and determining the first binary switching signal and the second binary switching signal from the current strength value.

18. The method of claim 17, further comprising:

assigning the sum measurement signal to a reference value from a plurality of reference values, wherein a unique combination of switching states is assigned to each reference value based at least in part on a reference value table; and uniquely determining the switching states based at least in part on the assignment of the sum measurement signal to the reference value.

19. The method of claim 17, further comprising:

providing an output signal with a current strength in a predetermined range based at least in part on the first binary switching signal and the second binary switching signal, the predetermined range being between 0 mA and 31 mA.

20. The method of claim 17, further comprising:

switching, by a first switching element connected upstream of the first signal input, a signal line, wherein the first binary switching signal is applied to the first signal input based at least in part on switching the signal line; and switching, by a second switching connected upstream of the second signal input, a further signal line, wherein the second binary switching signal is applied to the second signal input based at least in part on switching the further signal line.

* * * * *